(12) United States Patent
Wiltshire et al.

(10) Patent No.: US 7,170,363 B2
(45) Date of Patent: Jan. 30, 2007

(54) GUIDES FOR R.F. MAGNETIC FLUX

(75) Inventors: Michael Charles Keogh Wiltshire, High Wycombe (GB); Ian Robert Young, Malborough (GB)

(73) Assignee: Marconi UK Intellectual Property Ltd., Coventry (GB)

( * ) Notice: Subject to any disclaimer, the term of this patent is extended or adjusted under 35 U.S.C. 154(b) by 786 days.

(21) Appl. No.: 10/220,734

(22) PCT Filed: Mar. 6, 2001

(86) PCT No.: PCT/GB01/00970

§ 371 (c)(1),
(2), (4) Date: Nov. 25, 2002

(87) PCT Pub. No.: WO01/67550

PCT Pub. Date: Sep. 13, 2001

(65) Prior Publication Data

US 2003/0146801 A1    Aug. 7, 2003

(30) Foreign Application Priority Data

Mar. 6, 2000    (GB) ................. 0005349.6

(51) Int. Cl.
*G01V 3/00*    (2006.01)
*H04B 3/28*    (2006.01)
*H01P 1/26*    (2006.01)
*H05K 9/00*    (2006.01)

(52) U.S. Cl. .................. 333/12; 324/300; 174/353

(58) Field of Classification Search ............. 333/12, 333/22 R, 24 R
See application file for complete search history.

(56) References Cited

U.S. PATENT DOCUMENTS 5,223,849 A    6/1993    Kasevich et al.

(Continued)

FOREIGN PATENT DOCUMENTS

WO    WO 00/41270 A1    7/2000

(Continued)

OTHER PUBLICATIONS

Pendry et al., "Magnetism From Conductors And Enhanced Non-linear Phenomena", IEEE Transactions ON Microwave Theory And Techniques, vol. 47(11):2075-2084, (1999).

(Continued)

*Primary Examiner*—Robert Pascal
*Assistant Examiner*—Kimberly E. Glenn
(74) *Attorney, Agent, or Firm*—Venable LLP; Robert Kinberg; Catherine M. Voorhees

(57)    ABSTRACT

Microstructure materials which can be tuned to a particular range of r.f. frequencies to display particular magnetic permeabilities have been proposed. A typical material is made of an array of capacitive elements e.g. spirals or rolls of conducting material on a non-conducting substrate. These materials can be used as a guide which is effective for the particular band of frequencies to which it is tuned. In one example, the rolls (2a to 2c) guide magnetic flux along ducts (1, 2, 3) while rolls (4a, 5a) guide magnetic flux along ducts (4, 5). Flux can thus be guided upwardly along duct (2), along ducts (4 and 5), and down ducts (1, 3), or vice versa.

10 Claims, 1 Drawing Sheet

U.S. PATENT DOCUMENTS

| | | | |
|---|---|---|---|
| 5,270,656 A * | 12/1993 | Roberts et al. | 324/318 |
| 5,363,845 A * | 11/1994 | Chowdhury et al. | 600/422 |
| 5,760,584 A * | 6/1998 | Frederick | 324/318 |
| 6,043,658 A * | 3/2000 | Leussler | 324/318 |
| 6,535,755 B2 * | 3/2003 | Ehnholm | 600/423 |
| 6,608,811 B1 * | 8/2003 | Holden et al. | 361/303 |
| 6,768,051 B2 * | 7/2004 | Wiltshire et al. | 174/35 R |
| 6,801,173 B2 * | 10/2004 | Wiltshire | 343/787 |
| 6,819,106 B2 * | 11/2004 | Young et al. | 324/318 |
| 6,927,574 B2 * | 8/2005 | Young et al. | 324/318 |

FOREIGN PATENT DOCUMENTS

| | | |
|---|---|---|
| WO | WO 01/67125 A1 | 9/2001 |
| WO | WO 01/67549 A2 | 9/2001 |

OTHER PUBLICATIONS

Wiltshire M.C.K., et al, "Microstructured Magnetic Materials for RF Flux Guides in Magnetic Resonance Imaging"; Science American Association for the Advancement of Science, US, vol. 291, No. 5505, Feb. 2, 2001, pp. 849-851.

Kwiat D, et al, :A Decoupled Coil Detector Array for Fast Image Acquisition in Magnetic Resonance Imaging, Medical Physics, American Institute of Physics, New York, US, vol. 18, No. 2, Mar. 1, 1991, pp. 251-265.

* cited by examiner

GUIDES FOR R.F. MAGNETIC FLUX

BACKGROUND OF THE INVENTION

This invention relates to guides for r.f. magnetic flux.

Flux guiding or flux concentration is conventionally performed using a ferrite core. Ferrites are not frequency selective, and that can be a benefit in some cases, for example a radio aerial, but in other cases, such as the IF stage of a radio, it is a disadvantage.

Microstructured materials have been proposed (IEEE Transactions on Microwave Theory and Techniques, 1999, 47, 2075–2084, Magnetism from Conductors and Enhanced Non-Linear Phenomena by J B Pendry, A J Holden, D J Robbins and W J Stewart, and International Patent Application WO 00/41270), in which the magnetic permeability depends on the frequency of oscillation of the magnetic field i.e. depends on the r.f. frequency.

Such materials comprise a structure with magnetic properties comprising an array of capacitive elements, the array exhibiting a predetermined magnetic permeability in response to incident electromagnetic radiation lying within a predetermined frequency band, wherein each element includes a low resistance conducting path and is such that a magnetic component of the electromagnetic radiation lying within the predetermined frequency band induces an electrical current to flow around said path and through said associated element, and wherein the size of the elements and their spacing apart are selected such as to provide a predetermined permeability in response to said received electromagnetic radiation. At least one dimension of each capacitive element is preferably less than the wavelength of the electromagnetic radiation. The capacitive elements may be in the form of conductive sheets wound as a spiral, or a plurality of stacked planar sections each of which is electrically isolated from each other and is in the form of a spiral. The further preferred features of the materials are disclosed and claimed in International Patent Application WO 00/41270, the contents of which are incorporated herein by reference.

Typically such materials consist of an array of capacitive elements at least one of whose dimensions is much smaller than the wavelength at which the desired permeability is exhibited, in which resonant interaction between the inductance of the structure and the capacitive elements causes electromagnetic energy to be shared between the magnetic fields and the electrostatic fields within the capacitive structure.

SUMMARY OF THE INVENTION

The invention provides a guide for r.f. magnetic flux which comprises an array of capacitive elements, the array exhibiting a predetermined magnetic permeability in response to incident electromagnetic radiation lying within a predetermined frequency band, wherein each capacitive element includes a low resistance conducting path and is such that a magnetic component of the electromagnetic radiation lying within the predetermined frequency band induces an electrical current to flow around said path and through said associated element, wherein the spacing of the elements is less than the wavelength of the radiation within the predetermined frequency band, and wherein the size of the elements and their spacing apart is selected such as to provide a magnetic permeability which is greater than that of free space to electromagnetic radiation in the predetermined frequency band.

Such a flux guide has the increased magnetic permeability only at the frequencies to which it is tuned, and is non-magnetic in steady magnetic fields.

Advantageously, the predetermined frequency band is within the HF band extending from 3 MHz to 30 MHz. Preferably, the predetermined frequency band is within the range extending from approximately 10 MHz to approximately 23 MHz.

The guide may include a first elongate region, and it may also include a second elongate region arranged end to end with the first elongate region, but inclined at an angle, for example, 90°, to the first elongate region.

The spacing of the elements may be less than one half, preferably less than one fifth, of the wavelength of the radiation within the predetermined frequency band. Further advantages may flow from making the element spacing less than a tenth, or less than one hundredth of the wavelength of the radiation within the predetermined frequency band.

The magnetic permeability of the duct may be in excess of 2, and could be in excess of 3. Advantages could be obtained if the magnetic permeability was in excess of 5.

The invention also provides a method of designing a guide for r.f. magnetic flux, which comprises selecting the dimensions of capacitive elements arranged in an array, the array exhibiting a predetermined magnetic permeability in response to incident electromagnetic radiation lying within a predetermined frequency band, in which capacitive elements currents can be induced by the radio frequency electromagnetic radiation, and selecting the spacing apart of the capacitive elements to be less than the wavelength of the radiation within the predetermined frequency band, and the size and the spacing of the elements in order to provide a magnetic permeability for the screen in response to the electromagnetic radiation within the predetermined frequency band which is greater than that of air.

BRIEF DESCRIPTION OF THE DRAWINGS

A guide for r.f. magnetic flux, and a method of designing such a guide, will now be described in detail, by way of example, with reference to the accompanying drawings, in which.

DETAILED DESCRIPTION OF THE INVENTION

Figure 1:
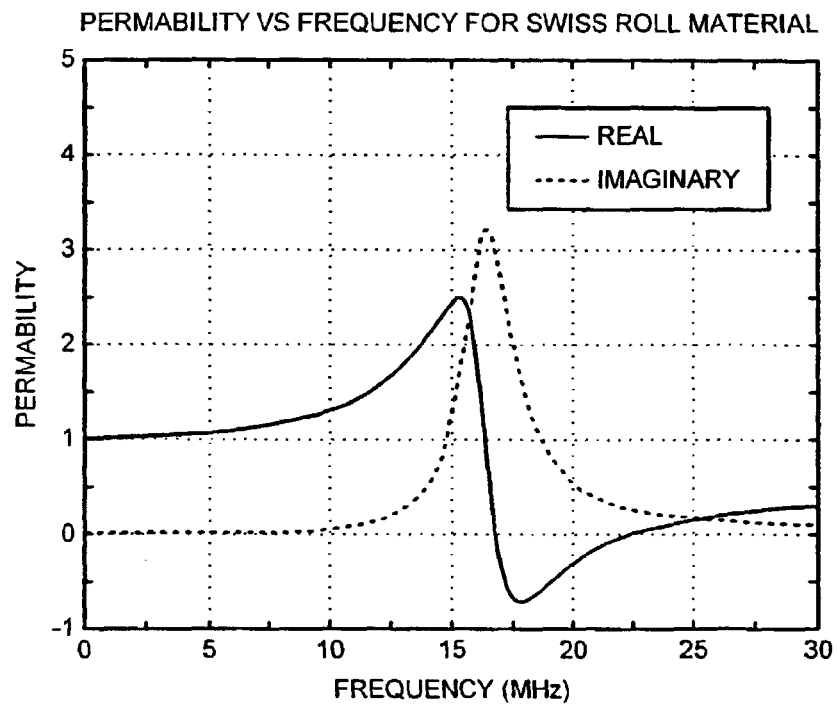
FIG. 1 is a graph showing the variation of the real and imaginary parts of the permeability of the guide, with frequency.
Figure 2:
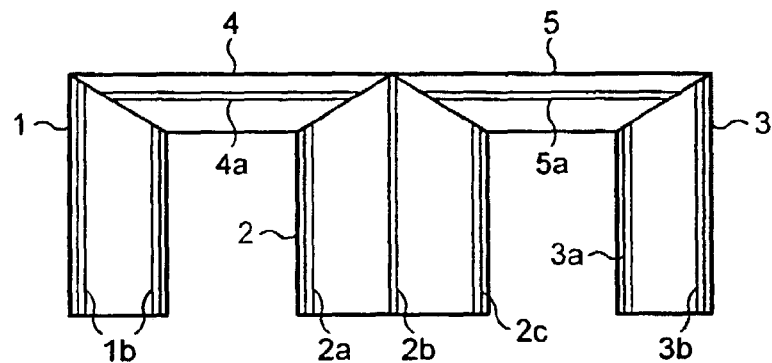
FIG. 2 is a section through the flux guide.
Figure 3:
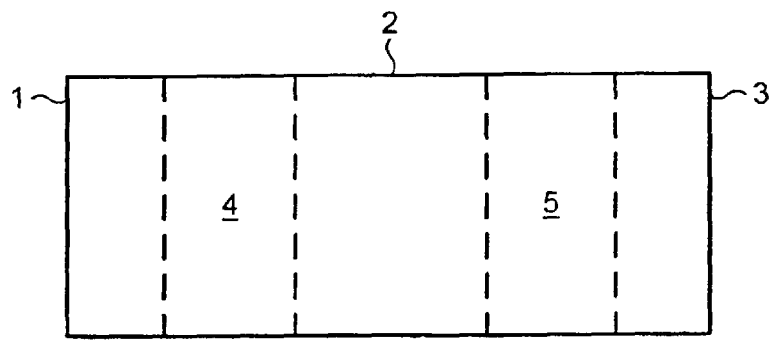
FIG. 3 is a plan view of the guide.

The flux guide shown in FIG. 2 consists of five sections all made of the microstructured material. As seen in FIG. 2, the sections 1, 2 and 3 are arranged vertically, and have an array of rolls which extend in a vertical direction. The upper ends of the sections 1, 2 and 3 are bevelled, and connected to correspondingly bevelled sections 4, 5. All the parts 1 to 5 are made of microstructured material having an array of rolls forming capacitive elements which are closely spaced, as described in the IEEE article and in International Patent Application WO 00/41270.

As described in the IEEE article, the magnetic vector of electromagnetic radiation is guided along the length of the rolls, and the rolls are arranged vertically in the parts 1 to 3 and horizontally in the parts 4 and 5, as seen in FIG. 2. A few rolls only have been illustrated in the parts e.g. 1a, 1b, 4a, 5a, 2a, 2b, 2c and 3a, 3b.

Accordingly, the flux guide would be suitable for guiding electromagnetic radiation the magnetic vector of which entered the region 2 axially upwardly through the region 2, then horizontally through the regions 4 and 5 and then downwardly through the regions 1 and 3 (or vice versa).

There is no need for the elongate regions 1–3 and 4, 5 to be arranged at right angles. Depending on the application, other inclinations are possible, for example, a curved guide could be made of a plurality of straight sections each joined end to end and inclined relative to its neighbours.

The flux guides have use in magnetic resonance imaging apparatus as described in our co-pending British Application No. 0005351.2, but have many other applications as well, for example, in the IF stage of a radio.

The IF stage of a radio or communications receiver is designed to operate in a single frequency band: the tuning is carried out up-stream of the IF stage, and the signal is down-converted by heterodyne mixing to provide a fixed frequency signal for further conditioning. Given a single frequency, it would be advantageous to use the microstructured material as a core for inductors or mutual inductors, so that these components were not sensitive to frequencies other than the design frequency (i.e. noise).

While not suitable for use in a TV aerial, because it needs to be broad band, after mixing with the local oscillator, the signal appears at a single, well-defined frequency, so the material could be used in the subsequent stages.

For the same reasons, the material could be used to provide selectivity in communications systems, particularly those whose frequency bands is comparatively narrow, such as at ~2.5 GHz and at ~5 GHz

EXAMPLE

In one example of roll material, the material consists of cylindrical elements, with each cylinder being a "Swiss Roll". They are made of 37 turns of film, wound on a 8 mm diameter, non-magnetic core (a glass-reinforced plastic, GRP, rod). The film is a proprietary material, known as ProFilm, which consists of a Mylar base, coated with about 10 nm of aluminium and a glue layer, the whole being approximately 50 µm thick. The sheet resistance of the aluminium layer is about 2.7 Ω/square. The outer diameter of the cylinders is 11.4 mm, and the material is assembled in a hexagonal close packed lattice (i.e. as closely packed as possible). This construction provides a maximum permeability of µ=3 at 21.3 MHz and a permeability of air at other frequencies and steady state fields.

In another example, an alternative film is provided by the so-called "Superinsulation" used in superconducting magnet systems. This is a Mylar film of thickness 6.4 µm, coated with aluminium up to 50 nm thick. The sheet resistance of such a layer is ~0.5 Ω/square. If this material is wound for 18.7 turns onto a 6 mm diameter mandrel, the outer diameter becomes 6.4 nm, and the maximum permeability is µ=4.9 at 21.3 MHz, and of air at other frequencies and steady fields.

A significantly larger permeability can be achieved by including an additional Mylar interlayer. If the interlayer is 50 µm thick, so that the total layer thickness is 56.4 µm, then a permeability of µ=19.2 is obtained using 58.62 turns on a 6 mm mandrel, with an outer diameter of 12.6 mm.

Even greater permeabilities can be achieved by using more conductive films. In the above example, if the sheet resistance were reduced to 0.1 Ω/square, either by using a thicker film of aluminium or by using a different metal (such as silver), the permeability would be increased to 76.7.

The achievable permeability depends on the frequency: the lower the frequency, the larger the permeability, and conversely. Using the example above of a 56.4 µm thick layer, with a sheet resistance of 0.5 Ω/square, wound on a 6 mm diameter mandrel, using 113 turns provides a an outer diameter of 18.8 mm and a permeability of 23.8 at 10.6 MHz, whereas 14.5 turns (with an outer diameter of 7.6 mm) provides µ=11. Clearly, reducing the sheet resistance by increasing the metal thickness will increase the achievable permeability. Again, the permeability is that of air at other frequencies and in steady fields.

The design procedures for both guiding and shielding systems follow a similar approach. The first step is to define the frequency of interest. Then for guiding, we need to design the material so that the real part of the permeability is a maximum at that frequency. If reducing loss is particularly important, we would design the material so that the maximum in the real part of the permeability lay slightly above the frequency of interest, because this imaginary part (that gives rise to the loss) is falling faster than the real part in this frequency regime.

For shielding, there are two possible approaches. We can make the material so that the frequency of interest coincides with or lies slightly higher than the minimum (i.e. most negative) in the real part of the permeability. Alternatively, we can make the material so that the peak in the imaginary part of the permeability is at the frequency of interest. From a practical point of view, the former approach is preferred, although the latter may give slightly better performance.

Denoting $$\omega_0 = \sqrt{\frac{dc_0^2}{2\varepsilon\pi^2 r^3 (N-1)}} \text{ and } \gamma = \frac{2\sigma}{r\mu_0(N-1)}$$

we can write the permeability as $$\mu = 1 - \frac{F}{1 - (\omega_0/\omega)^2 + i\gamma/\omega}$$

where F is the filling factor, and r is the effective radius of the mandrel, taking into account the finite thickness of the "Swiss Roll" and the other parameters are as described in the original patent.

The extrema of the real part of the permeability fall at $$\omega_{max} = \frac{1}{\omega_0 - \gamma}\sqrt{\omega_0(\omega_0 - \gamma)} \text{ and } \omega_{min} = \frac{1}{\omega_0 + \gamma}\sqrt{\omega_0(\omega_0 + \gamma)}$$

for the maximum and minimum values respectively.

Given the material parameters d and σ, the permittivity of the film E, and the relationship between the effective radius and the core size, it is a simple matter to solve the above equations for the number of turns N that are required in the material. For example, using the material parameters of the first case described previously, we require N=32.5, and hence a resonant frequency of 23.4 MHz, to optimise the material for guiding. Better results would be provided by using the silver coated film as described previously: then to peak the real part of the permeability at 21.3 MHz requires 58.47 turns rather than the previous 58.62 turns, a difference in the total length of the film of 6 mm (in ~1680 mm).

As an alternative to "Swiss Rolls", columns of planar conducting elements as described in International Patent Application No. WO 00/41270 or British Patent Application No. 0005356.1, the contents of which are incorporated herein by reference, may be used.

The invention is also applicable to diathermy and r.f. hyperthermia.

The invention claimed is:

1. A guide for r.f. magnetic flux which comprises an array of capacitive elements, the array exhibiting a predetermined magnetic permeability in response to incident electromagnetic radiation lying within a predetermined frequency band, wherein each capacitive element includes a low resistance conducting path and is such that a magnetic component of the electromagnetic radiation lying within the predetermined frequency band induces an electrical current to flow around said path and through said associated element, wherein the spacing of the elements is less than the wavelength of the radiation within the predetermined frequency band, wherein the size of the elements and their spacing apart is selected such as to provide a magnetic permeability which is greater than that of free space to electromagnetic radiation in the predetermined frequency band, further including a first elongate region and a second elongate region, wherein the second elongate region is arranged end to end with the first elongate region but inclined at an angle to the first elongate region.

2. A guide as claimed in claim 1, in which the predetermined frequency band is within the HF band extending from 3 MHz to 30 MHz.

3. A guide as claimed in claim 2, in which the predetermined frequency band is within the range extending from approximately 10 MHz to approximately 23 MHz.

4. A guide as claimed in claim 1, in which the guide exhibits a negative magnetic permeability over a part of the predetermined frequency band.

5. A guide as claimed in claim 1, in which the capacitive elements are rolls of conducting material arranged with their axes extending lengthwise with respect to the respective elongate region.

6. A guide as claimed in claim 1, in which the capacitive elements are planar rings or spirals arranged in columns extending lengthwise with respect to the respective elongate region.

7. A guide as claimed in claim 1, in which the spacing of the elements is less than one half of the wavelength of the radiation within the predetermined frequency band.

8. A guide as claimed in claim 1, in which the spacing of the elements is less than one fifth of the wavelength of the radiation within the predetermined frequency band.

9. A guide as claimed in claim 1, in which the spacing of the elements is less than one tenth of the wavelength of the radiation within the predetermined frequency band.

10. A method of designing a guide for r.f. magnetic flux, which comprises selecting the dimensions of capacitive elements arranged in an array, the array exhibiting a predetermined magnetic permeability in response to incident electromagnetic radiation lying within a predetermined frequency band, in which capacitive elements currents can be induced by the radio frequency electromagnetic radiation, selecting the spacing apart of the capacitive elements to be less than the wavelength of the radiation within the predetermined frequency band, and the size and the spacing of the elements in order to provide a magnetic permeability for the screen in response to the electromagnetic radiation within the predetermined frequency band which is greater than that of air, and including a first elongate region and a second elongate region, wherein the second elongate region is arranged end to end with the first elongate region but inclined at an angle to the first elongate region.

* * * * *